United States Patent
Hsieh et al.

(10) Patent No.: US 11,120,772 B1
(45) Date of Patent: Sep. 14, 2021

(54) SOURCE DRIVING CIRCUIT, DISPLAY APPARATUS AND OPERATION METHOD OF DISPLAY APPARATUS

(71) Applicant: NOVATEK Microelectronics Corp., Hsin-Chu (TW)

(72) Inventors: Cheng-Tsu Hsieh, Taoyuan (TW); Sou-Chieh Chang, Hsinchu (TW); Ying-Hsiang Wang, New Taipei (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 0 days.

(21) Appl. No.: 16/847,589

(22) Filed: Apr. 13, 2020

(51) Int. Cl.
| | | |
|---|---|---|
| *G09G 5/10* | (2006.01) | |
| *H03F 3/45* | (2006.01) | |
| *G05F 3/08* | (2006.01) | |

(52) U.S. Cl.
CPC ............... *G09G 5/10* (2013.01); *G05F 3/08* (2013.01); *H03F 3/45273* (2013.01); *G09G 2320/0209* (2013.01); *G09G 2320/0673* (2013.01)

(58) Field of Classification Search
CPC .. G09G 3/3291; G09G 3/3233; G09G 3/2007; G09G 3/2003; G09G 3/3266; G09G 2320/0276; G09G 2320/0242; G09G 2310/0291; G09G 2320/0646; G09G 2330/028; G09G 2320/0223; G09G 2320/0233; G09G 2320/0666; G09G 3/3258; G09G 3/3275; G09G 3/3688; G09G 3/3696; G09G 5/10; G09G 2320/0673; G09G 2320/0209; G05F 3/08; H03F 3/45273
See application file for complete search history.

(56) References Cited

U.S. PATENT DOCUMENTS

| | | | | |
|---|---|---|---|---|
| 10,431,171 | B2* | 10/2019 | Kim ..................... | G09G 3/3614 |
| 2014/0168043 | A1* | 6/2014 | Zhang .................. | G09G 3/3692 |
| | | | | 345/90 |
| 2015/0356932 | A1* | 12/2015 | Kim ..................... | G09G 3/3688 |
| | | | | 345/690 |
| 2019/0333466 | A1* | 10/2019 | Zhou .................... | G09G 3/3696 |
| 2020/0135119 | A1* | 4/2020 | Nakayama ........... | G09G 3/2003 |

* cited by examiner

*Primary Examiner* — Rodney Amadiz
(74) *Attorney, Agent, or Firm* — Winston Hsu

(57) ABSTRACT

A source driving circuit, a display apparatus and an operation method are provided. The source driving circuit includes a reference voltage generating circuit, a plurality of compensation circuits, a gamma voltage generating circuit and a digital to analog converter. The reference voltage generating circuit is configured to generate a plurality of gamma reference voltages. The plurality of compensation circuits are coupled to the reference voltage generating circuit and configured to generate a plurality of compensated gamma reference voltages according to the plurality of gamma reference voltages and a voltage associated with a common voltage. The gamma voltage generating circuit is configured to generate a plurality of gamma voltages according to the plurality of compensated gamma reference voltages. The digital to analog converter is configured to generate a plurality of data driving voltages corresponding to image data according to the plurality of gamma voltages.

20 Claims, 8 Drawing Sheets

SOURCE DRIVING CIRCUIT, DISPLAY APPARATUS AND OPERATION METHOD OF DISPLAY APPARATUS

BACKGROUND OF THE INVENTION

1. Field of the Invention

The present invention relates to a source driving circuit, display apparatus and operation method, and more particularly, to a source driving circuit, display apparatus and operation method capable of reducing crosstalk effect.

2. Description of the Prior Art

With rapid development of display technology, traditional cathode ray tube (CRT) displays have been gradually replaced by liquid crystal displays (LCDs). An LCD device utilizes a source driving circuit and a gate driving circuit to drive pixels on a display panel to display images. A common voltage (VCOM) may be applied to a common electrode for each row of pixels. As the common voltage is affected by noise, a common voltage distortion may occur, such that a horizontal crosstalk problem may happen, resulting in color inaccuracy. The conventional method usually dynamically adjusts the common voltage for compensation by using a feedback common voltage circuit. However, the problem of crosstalk cannot be solved effectively due to the heavy load of the common electrode. Thus, there is a need for improvement.

SUMMARY OF THE INVENTION

It is therefore an objective of the present invention to provide a source driving circuit, display apparatus and operation method capable of reducing crosstalk effect to solve the abovementioned problem.

According to an embodiment of the present invention, a source driving circuit is provided. The source driving circuit includes a reference voltage generating circuit, configured to generate a plurality of gamma reference voltages; a plurality of compensation circuits, coupled to the reference voltage generating circuit and configured to generate a plurality of compensated gamma reference voltages according to the plurality of gamma reference voltages and a voltage associated with a common voltage; a gamma voltage generating circuit, coupled to the plurality of compensation circuits and configured to generate a plurality of gamma voltages according to the plurality of compensated gamma reference voltages; and a digital to analog converter, coupled to the gamma voltage generating circuit and configured to generate a plurality of data driving voltages corresponding to image data according to the plurality of gamma voltages.

According to an embodiment of the present invention, a display apparatus is provided. The display apparatus includes a display panel, comprising a plurality of pixels, wherein each pixel is driven according to a respective data voltage; and a source driving circuit, comprising: a reference voltage generating circuit, configured to generate a plurality of gamma reference voltages; a plurality of compensation circuits, coupled to the reference voltage generating circuit and configured to generate a plurality of compensated gamma reference voltages according to the plurality of gamma reference voltages and a voltage associated with a common voltage; a gamma voltage generating circuit, coupled to the plurality of compensation circuits and configured to generate a plurality of gamma voltages according to the plurality of compensated gamma reference voltages; and a digital to analog converter, coupled to the gamma voltage generating circuit and configured to generate a plurality of data driving voltages corresponding to image data to drive the pixels of the display panel according to the plurality of gamma voltages.

According to an embodiment of the present invention, an operation method of a display apparatus is provided. The operation method of the display apparatus includes a generating a plurality of gamma reference voltages; generating a plurality of compensated gamma reference voltages according to the plurality of gamma reference voltages and a voltage associated with a common voltage; generating a plurality of gamma voltages according to the plurality of compensated gamma reference voltages; and generating a plurality of data driving voltages corresponding to image data to drive pixels of a display panel of the display apparatus according to the plurality of gamma voltages.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, hardware manufacturers may refer to a component by different names. This document does not intend to distinguish between components that differ in name but not function. In the following description and in the claims, the terms "include" and "comprise" are utilized in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
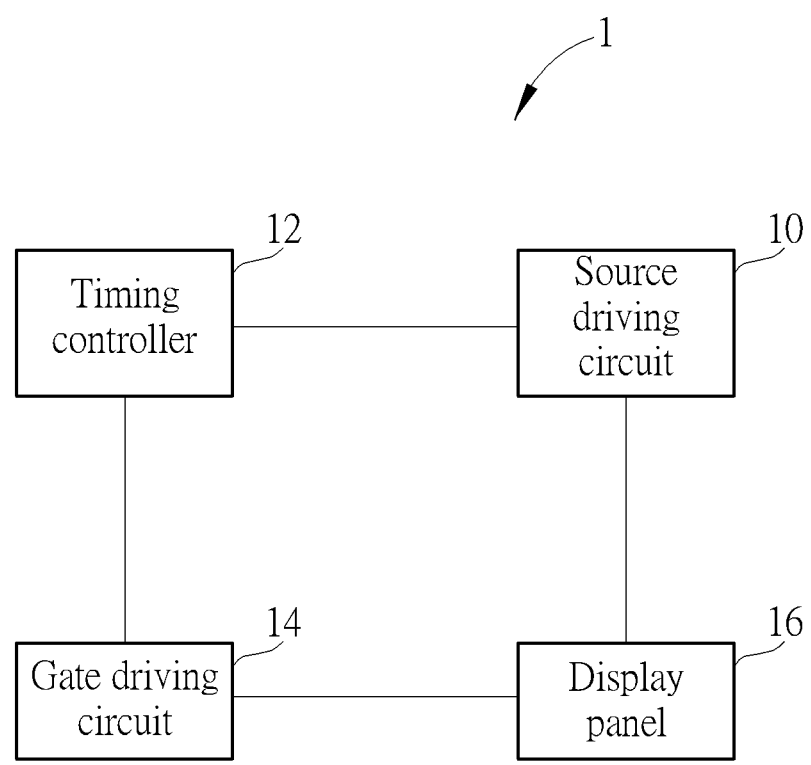
FIG. 1 is a schematic diagram of a display apparatus according to an embodiment of the present invention.

Please refer to FIG. 1, which is a schematic diagram of a display apparatus 1 according to an embodiment of the present invention. The display apparatus 1 may be a liquid crystal display (LCD), but not limited thereto. As shown in FIG. 1, the display apparatus 1 includes a source driving circuit 10, a timing controller 12, a gate driving circuit 14 and a display panel 16. The display panel 16 includes a plurality of pixels arranged in a matrix pattern. Each pixel may be driven according to a data voltage. Groups of pixels (e.g., a row, a column) of the display panel 16 may share a common electrode and a common voltage VCOM may be applied to the common electrode. The timing controller 12 is configured to receive image data from an image processor and provide the image data to the source driving circuit 10. The gate driving circuit 14 is configured to provide gate driving signals to turn on respective pixel rows of the display panel 16. The source driving circuit 10 is configured to generate data driving voltages to drive pixels of the display panel 16 via data lines according to the image data and a voltage VCOMP associated with the common voltage VCOM such that the display panel 16 displays images corresponding to the image data.

Figure 2:
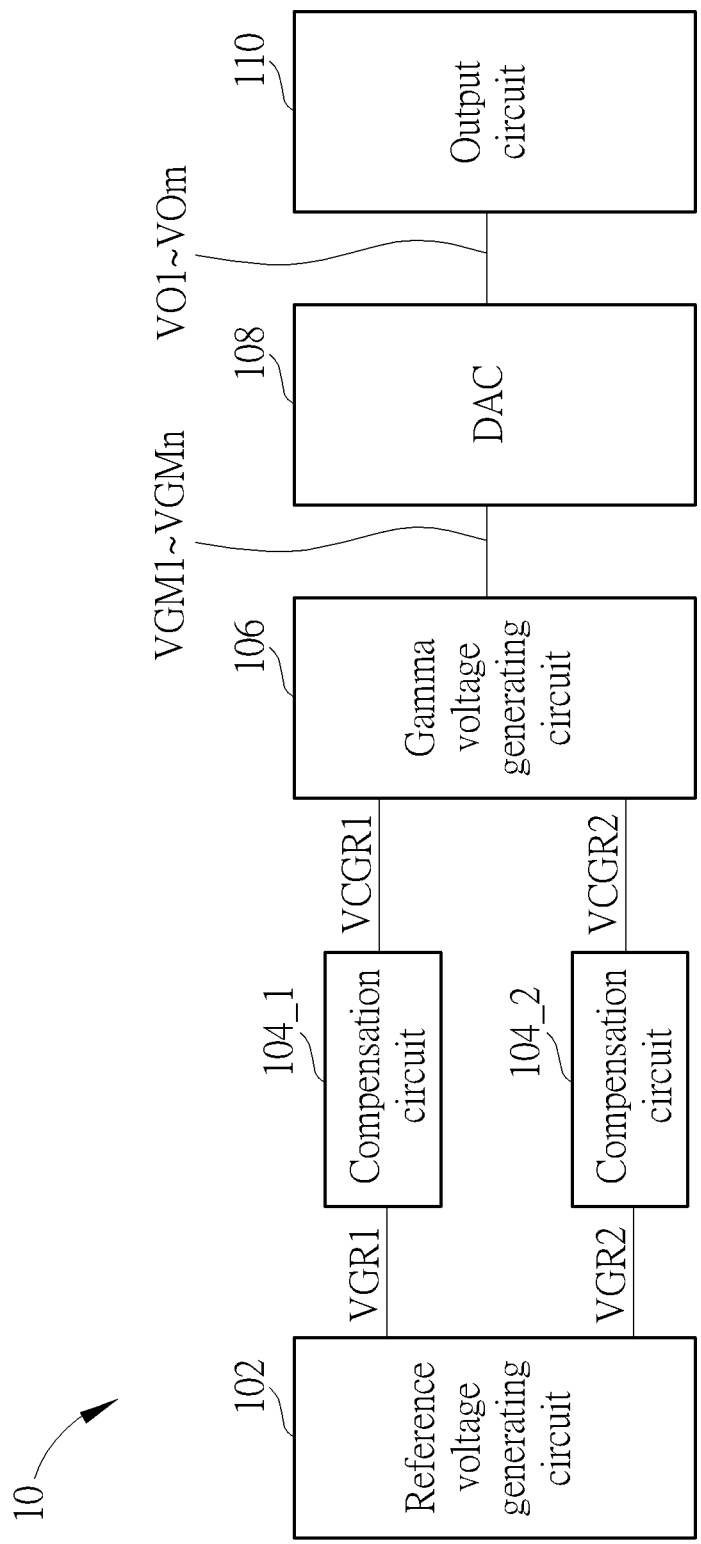
FIG. 2 is a schematic diagram of the source driving circuit shown in FIG. 1 according to an embodiment of the present invention.

Please refer to FIG. 2, which is a schematic diagram of the source driving circuit 10 shown in FIG. 1 according to an embodiment of the present invention. The source driving circuit 10 includes a reference voltage generating circuit 102, compensation circuits 104_1 and 104_2, a gamma voltage generating circuit 106, a digital to analog converter (DAC) 108 and an output circuit 110. The reference voltage generating circuit 102 is configured to generate a plurality of gamma reference voltages according to a gamma curve. For example, the reference voltage generating circuit 102 is configured to generate gamma reference voltages VGR1 and VGR2 according to a gamma curve. The gamma reference voltage VGR1 may be a maximum gamma voltage based on the gamma curve and correspond to the maximum grayscale level among all grayscale levels before common voltage noise compensation. The gamma reference voltage VGR2 may be a minimum gamma voltage based on the gamma curve and correspond to the minimum grayscale among all grayscales before common voltage noise compensation. For example, for a 256 grayscale levels (e.g., grayscale levels 0 to 255) of 8 bits color scheme, the gamma reference voltage VGR1 may be a maximum gamma voltage corresponding to the grayscale 255 among grayscales 0-255 before compensation. The gamma reference voltage VGR2 may be a minimum gamma voltage corresponding to the grayscale 0 among grayscales 0-255 before compensation.

The compensation circuits 104_1 and 104_2 are coupled to the reference voltage generating circuit 102. The compensation circuit 104_1 is configured to receive the gamma reference voltage VGR1 and generate a compensated gamma reference voltage VCGR1 according to the gamma reference voltage VGR1 and a voltage VCOMP associated with a common voltage VCOM. The compensation circuits 104_2 is configured to receive the gamma reference voltage VGR2 and generate a compensated gamma reference voltage VCGR2 according to the gamma reference voltage VGR2 and the voltage VCOMP associated with the common voltage VCOM. The voltage VCOMP may be equal to the common voltage VCOM. The voltage VCOMP may be proportional to the common voltage VCOM. The voltage VCOMP may be a portion of common voltage VCOM. The compensation circuits 104_1 and 104_2 may receive voltage VCOMP via metal wires connected to the common electrode on the display panel 16.

Moreover, each of the compensation circuits 104_1 and 104_2 may be configured to generate a respective compensated gamma reference voltage by adding the received gamma reference voltage with at least a first ratio of the voltage associated with the common voltage. For example, the compensated gamma reference voltage VCGR1 may be a sum of the gamma reference voltage VGR1 and the voltage VCOMP associated with a common voltage VCOM. The compensated gamma reference voltage VCGR2 may be a sum of the gamma reference voltage VGR2 and the voltage VCOMP associated with a common voltage VCOM. Therefore, each of the compensated gamma reference voltages VCGR1 and VCGR2 generated by the compensation circuits 104_1 and 104_2 includes at least a portion of the signal component of the common voltage VCOM. As the common voltage VCOM is provided to the common electrode, some noise may have impact on the common voltage VCOM, a noise component may be introduced in the common voltage VCOM. Under such a condition, variations of the common voltage VCOM may be accordant with the noise included in the common voltage VCOM. Variations of the common voltage VCOM may be accordant with the noise included in the common voltage VCOM. Variations of the compensated gamma reference voltages VCGR1 and VCGR2 may also be accordant with the noise included in the common voltage VCOM since both the compensated gamma reference voltages VCGR1 and VCGR2 include at least a portion of the signal component of the common voltage VCOM.

Figure 3:
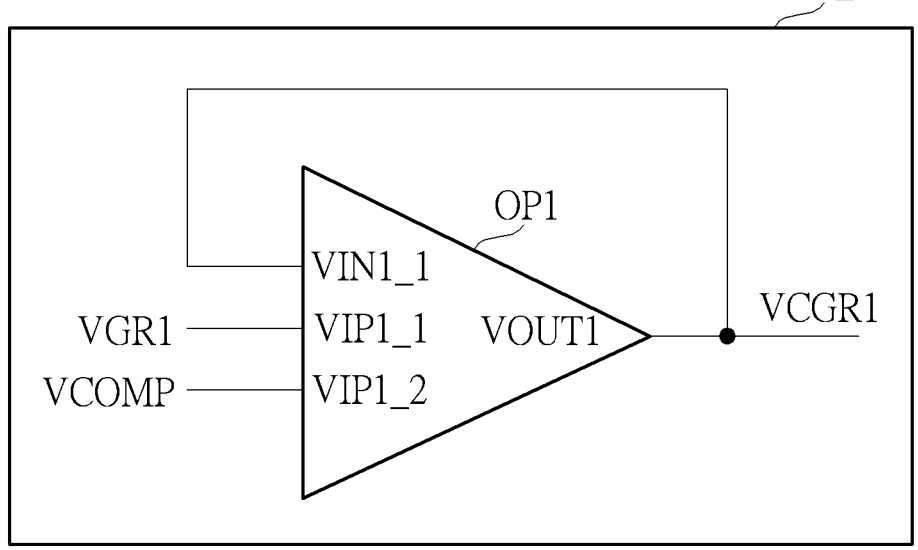
FIG. 3 is a schematic diagram of the compensation circuits shown in FIG. 2 according to an embodiment of the present invention.
Figure 3:
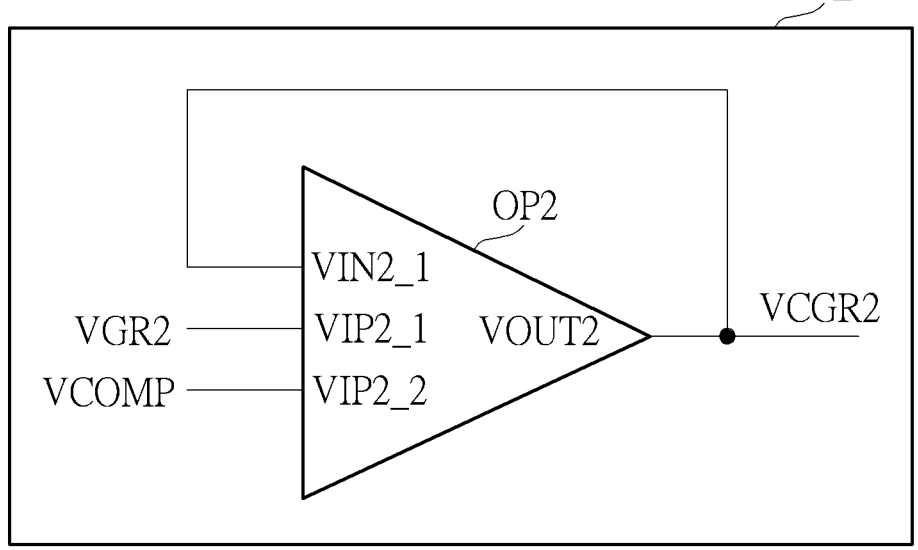

FIG. 3 is a schematic diagram of the compensation circuits 104_1 and 104_2 shown in FIG. 2 according to an embodiment of the present invention. As shown in FIG. 3, the compensation circuit 104_1 includes an amplifier circuit OP1 which generates a compensated gamma reference voltage VCGR1 according to a gamma reference voltage VGR1 and a voltage VCOMP associated with a common voltage VCOM. An input terminal VIN1_1 of the amplifier circuit OP1 is coupled to an output terminal VOUT1 of the amplifier circuit OP1. An input terminal VIP1_1 of the amplifier circuit OP1 is coupled to the reference voltage generating circuit 102 for receiving the generate gamma reference voltage VGR1. An input terminal VIP1_2 of the amplifier circuit OP1 is configured to receive the voltage VCOMP associated with the common voltage VCOM. The output terminal VOUT1 of the amplifier circuit OP1 is configured to output the compensated gamma reference voltage VCGR1. The compensated gamma reference voltage VCGR1 may be a sum of the gamma reference voltage VGR1 and the voltage VCOMP associated with the common voltage VCOM. The input terminals VIP1_1 and VIP1_2 of the amplifier circuit OP1 may be non-inverting terminals, and the input terminal VIN1_1 of the amplifier circuit OP1 may be an inverting terminal.

Similarly, the compensation circuit 104_2 includes an amplifier circuit OP2 which generates a compensated gamma reference voltage VCGR2 according to a gamma reference voltage VGR2 and a voltage VCOMP associated with a common voltage VCOM. An input terminal VIN2_1 of the amplifier circuit OP2 is coupled to an output terminal VOUT2 of the amplifier circuit OP2. An input terminal VIP2_1 of the amplifier circuit OP2 is coupled to the reference voltage generating circuit 102 for receiving the generate gamma reference voltage VGR2. An input terminal VIP2_2 of the amplifier circuit OP2 is configured to receive the voltage VCOMP associated with the common voltage VCOM. The output terminal VOUT2 of the amplifier circuit OP2 is configured to output the compensated gamma reference voltage VCGR2. The compensated gamma reference voltage VCGR2 is a sum of the gamma reference voltage VGR2 and the voltage VCOMP associated with the common voltage VCOM. The input terminals VIP2_1 and VIP2_2 of the amplifier circuit OP2 may be non-inverting terminals, and the input terminal VIN2_1 of the amplifier circuit OP2 may be an inverting terminal.

Figure 4:
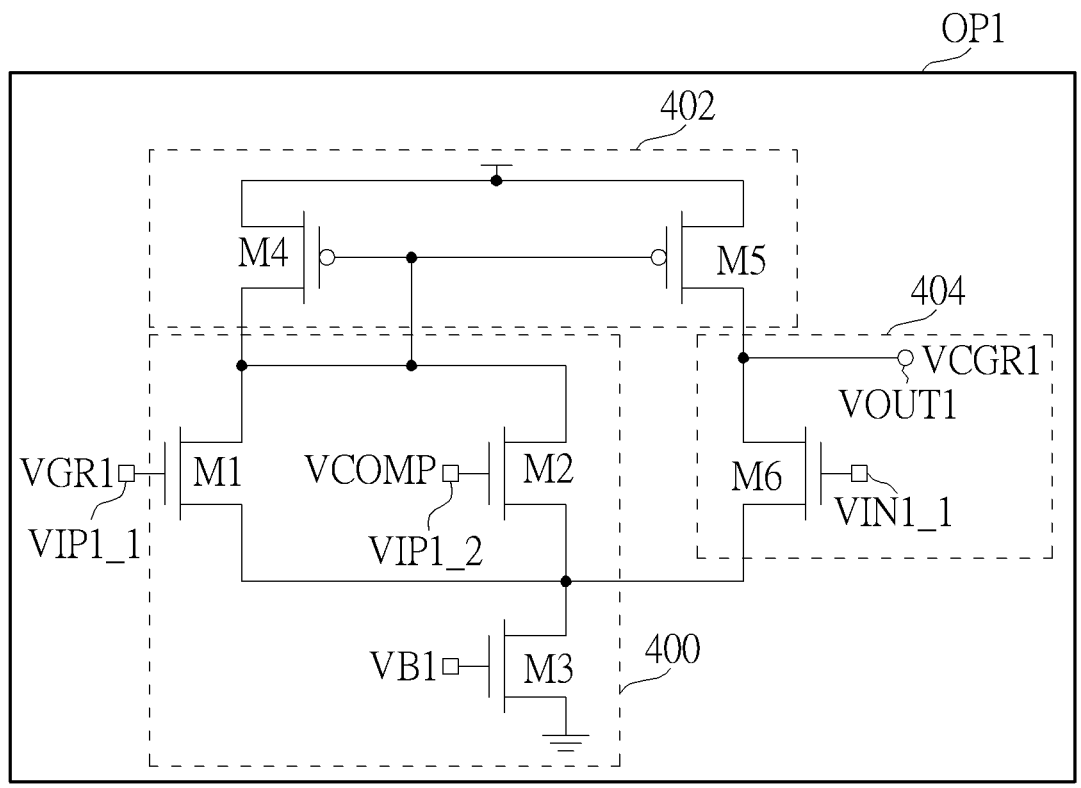
FIG. 4 and FIG. 5 are schematic diagrams of the amplifier circuits of the compensation circuits shown in FIG. 3 according to embodiments of the present invention.

FIG. 4 is a schematic diagram of the amplifier circuit OP1 of the compensation circuit 104_1 shown in FIG. 3 according to an embodiment of the present invention. The amplifier circuit OP1 includes an input stage 400, a current mirror 402 and an output stage 404. The input stage 400 includes transistors M1-M3. The transistors M1-M3 may be n-type transistors. For example, the transistors M1-M3 may be n-type metal oxide semiconductor (NMOS) transistors. The gate terminal of the transistor M1 serves as the input terminal VIP1_1 of the amplifier circuit OP1. The gate terminal of the transistor M1 is coupled to the reference voltage generating circuit 102 to receive the gamma reference voltage VGR1. The gate terminal of the transistor M2 serves as the input terminal VIP1_2 of the amplifier circuit OP1. The gate terminal of the transistor M2 is configured to receive the voltage VCOMP associated with the common voltage VCOM. The gate terminal of the transistor M3 is configured to receive a bias voltage VB1. The drain terminal of the transistors M3 is coupled to the source terminal of the transistor M1 and the source terminal of the transistor M2.

The current mirror 402 includes transistors M4-M5. The transistors M4-M5 may be p-type transistors. For example, the transistors M4-M5 may be p-type metal oxide semiconductor (PMOS) transistors. The gate terminal of the transistor M4 is coupled to the drain terminal of the transistor M4, the drain terminal of the transistor M1 and the drain terminal of the transistor M2. The source terminal of the transistor M4 is coupled to a power supply to receive a supply voltage. The gate terminal of the transistor M5 is coupled to the gate terminal and the drain terminal of the transistor M4, the drain terminal of the transistors M1 and the drain terminal of the transistors M2. The source terminal of the transistors M5 is coupled to the power supply to receive the supply voltage. The output stage 404 includes a transistor M6. The gate terminal of the transistor M6 serves as the input terminal VIN1_1 of the amplifier circuit OP1. The drain terminal of the transistor M6 serves as the output terminal VOUT1 of the amplifier circuit OP1. The drain terminal of the transistor M6 is coupled to the drain terminal of the transistor M5. The compensated gamma reference voltage CCGR1 is outputted via the drain terminal of the transistor M6. The source terminal of the transistor M6 is coupled to the drain terminal of the transistors M3, the source terminal of the transistor M1 and the source terminal of the transistor M2.

Figure 5:
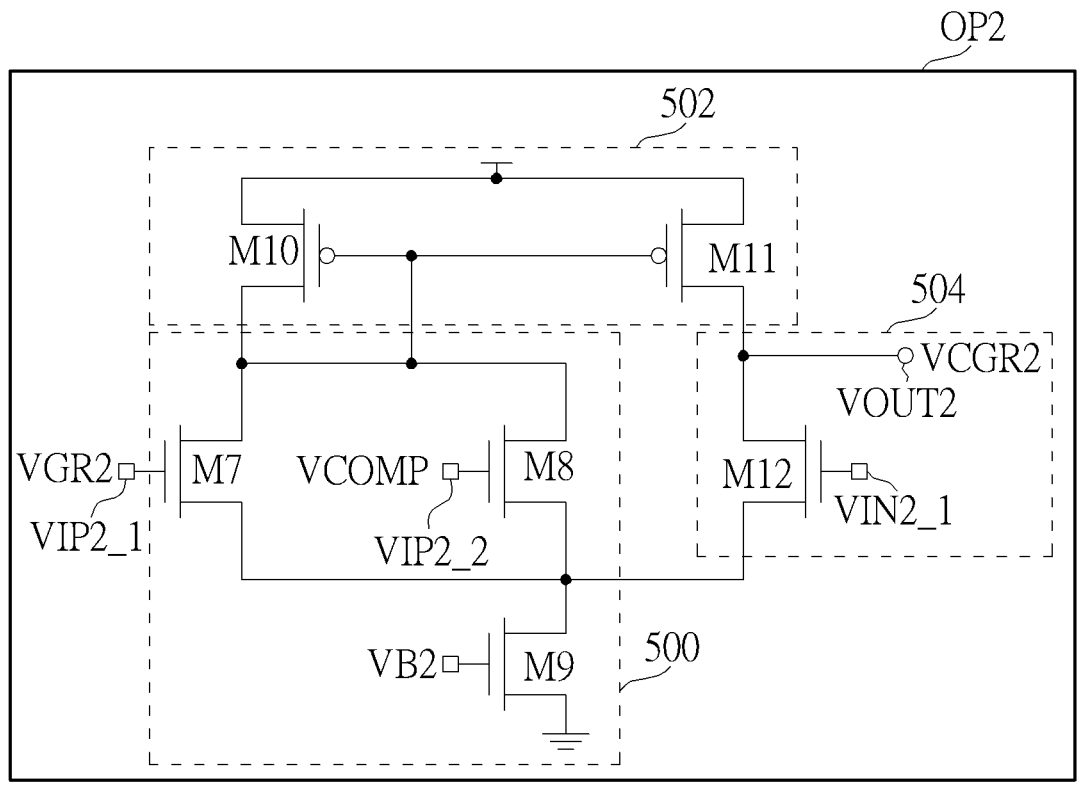

FIG. 5 is a schematic diagram of the amplifier circuit OP2 of the compensation circuits 104_2 shown in FIG. 3 according to an embodiment of the present invention. Similar to the amplifier circuit OP1 of the compensation circuits 104_1 shown in FIG. 4, the amplifier circuit OP2 includes an input stage 500, a current mirror 502 and an output stage 504. The input stage 500, a current mirror 502 and an output stage 504 in the amplifier circuit OP2 have similar structures and functions as the input stage 400, a current mirror 402 and an output stage 404 in the amplifier circuit OP1, which generates a respective compensated gamma reference voltage VCGR2 according to a gamma reference voltage VGR2 and a voltage VCOMP associated with a common voltage VCOM. As shown in FIG. 5, the input stage 400 includes transistors M7-M9. The transistors M7-M9 may be n-type transistors. For example, the transistors M7-M9 may be NMOS transistors. The gate terminal of the transistor M7 serves as the input terminal VIP2_1 of the amplifier circuit OP2. The gate terminal of the transistor M7 is coupled to the reference voltage generating circuit 102 to receive the gamma reference voltage VGR2. The gate terminal of the transistor M8 serves as the input terminal VIP2_2 of the amplifier circuit OP2. The gate terminal of the transistor M8 is configured to receive the voltage VCOMP associated with the common voltage VCOM. The gate terminal of the transistor M9 is configured to receive a bias voltage VB2. The drain terminal of the transistors M9 is coupled to the source terminal of the transistor M7 and the source terminal of the transistor M8.

The current mirror 502 includes transistors M10 and M11. The transistors M10 and M11 may be p-type transistors. For example, the transistors M10 and M11 may be PMOS transistors. The gate terminal of the transistor M10 is coupled to the drain terminal of the transistor M10, the drain terminal of the transistor M7 and the drain terminal of the transistor M8. The source terminal of the transistor M10 is coupled to the power supply to receive the supply voltage. The gate terminal of the transistor M11 is coupled to the gate terminal and the drain terminal of the transistor M10, the drain terminal of the transistors M7 and the drain terminal of the transistors M8. The source terminal of the transistors M11 is coupled to the power supply to receive the supply voltage. The output stage 504 includes a transistor M12. The gate terminal of the transistor M12 serves as the input terminal VIN2_1 of the amplifier circuit OP2. The drain terminal of the transistor M12 serves as the output terminal VOUT2 of the amplifier circuit OP2. The drain terminal of the transistor M12 is coupled to the drain terminal of the transistor M11. The compensated gamma reference voltage CCGR2 is outputted via the drain terminal of the transistor M12. The source terminal of the transistor M12 is coupled to the drain terminal of the transistors M9, the source terminal of the transistor M7 and the source terminal of the transistor M8.

In addition, PMOS transistors and NMOS transistors of the amplifier circuits OP1 and OP2 are used for illustration purpose. In practical applications, NMOS transistors may be replaced by NPN-type BJTs, and PMOS transistors may be replaced by PNP-type BJTs. Other types of transistors such as junction gate field effect transistor (JFET) may be used instead, or different types of transistors may be used instead.

Please further refer to FIG. 2, the gamma voltage generating circuit 106 is coupled to the reference voltage circuits 104_1 and 104_2 and is configured to generate gamma voltages VGM1-VGMn according to the compensated gamma reference voltages VCGR1 and VCGR2, where n represents the total number of grayscale levels. The gamma voltages VGM1-VGMn may correspond to n grayscale levels of image data. Each of the gamma voltages VGM1-VGMn may correspond to a respective grayscale. The gamma voltages VGM1-VGMn may be between the compensated gamma reference voltages VCGR1 and VCGR2. The gamma voltages VGM1-VGMn may be utilized as data driving voltages for driving pixels of the display panel 16. The compensated gamma reference voltage VCGR1 may be an upper limit level of a range of the gamma voltages VGM1-VGMn and the compensated gamma reference voltages VCGR2 may be a lower limit level of the range of the gamma voltages VGM1-VGMn. For example, the gamma voltage generating circuit 106 may divide the compensated gamma reference voltages VCGR1 and VCGR2 to generate the gamma voltages VGM1-VGMn.

Figure 6:
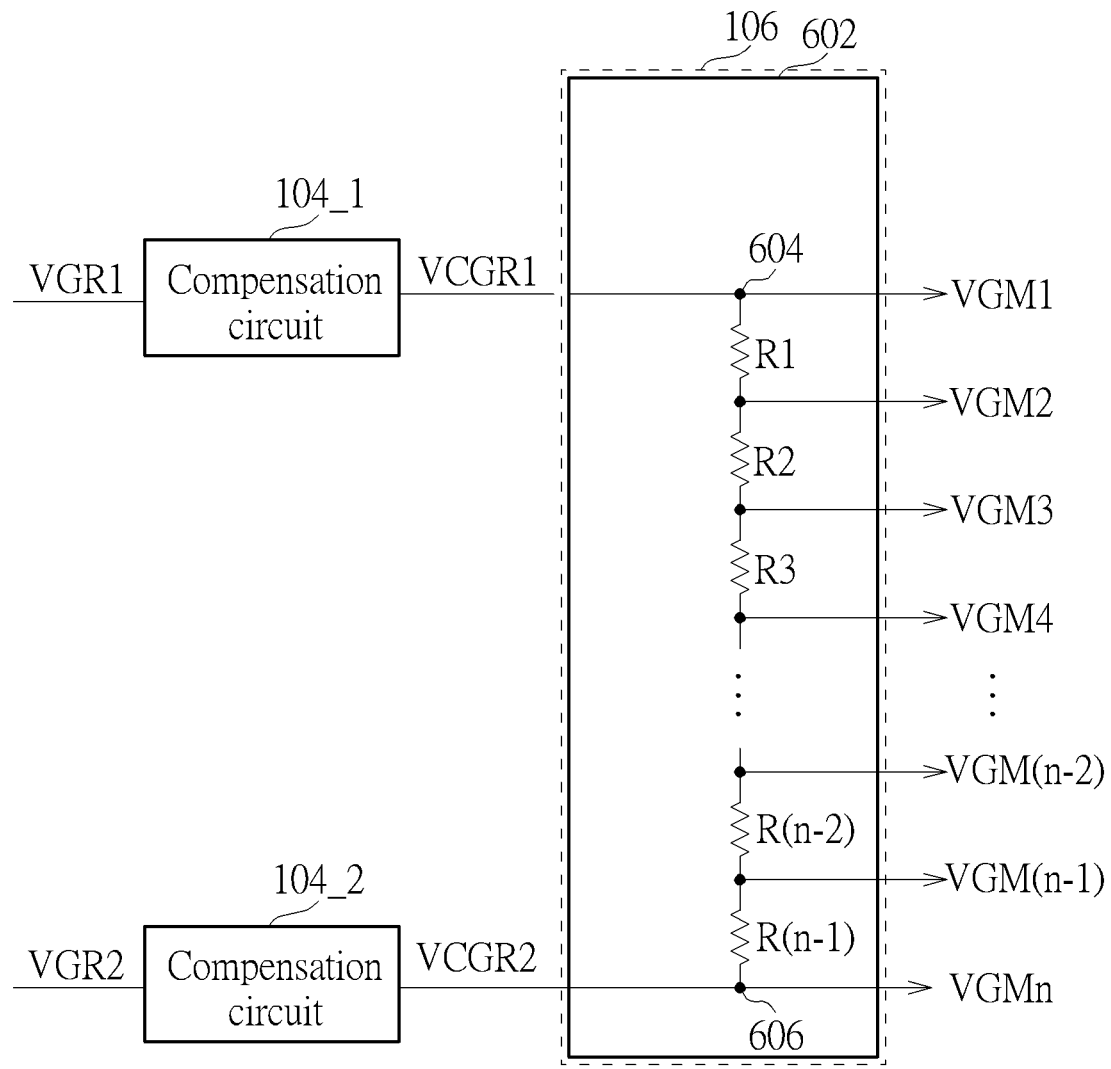
FIG. 6 is a schematic diagram of the gamma voltage generating circuit of the source driving circuit shown in FIG. 2 according to an embodiment of the present invention.

Please refer to FIG. 6, which is a schematic diagram of the gamma voltage generating circuit 106 of the source driving circuit 10 shown in FIG. 2 according to an embodiment of the present invention. As shown in FIG. 6, the gamma voltage generating circuit 106 includes a voltage dividing circuit 602. The voltage dividing circuit 602 may divide the compensated gamma reference voltages VCGR1 and VCGR2 to generate the gamma voltages VGM1-VGMn corresponding to a gamma curve. For example, as shown in FIG. 6, the voltage dividing circuit 602 may utilize a resistor string which is coupled between terminals 604 and 606. The voltage dividing circuit 602 includes resistors R1 to R(n−1). The resistors R1 to R(n−1) are connected between the terminals 604 and 606 in series. The reference voltage circuit 104_1 may be coupled to the terminal 604 and provide the compensated gamma reference voltages VCGR1. The reference voltage circuit 104_2 may be coupled to the terminal 606 and provide the compensated gamma reference voltages VCGR2. Under such a situation, the compensated gamma reference voltage VCGR1 serves as an upper reference voltage of the voltage dividing circuit 602, and the compensated gamma reference voltage VCGR2 serves as a lower reference voltage of the voltage dividing circuit 602. In an embodiment, the gamma voltage VGM1 corresponding to the maximum grayscale may be equal to the compensated gamma reference voltages VCGR1. The gamma voltage VGMn corresponding to the minimum grayscale may be equal to the compensated gamma reference voltage VCGR2. The gamma voltage VGM1 may be outputted via the terminal 604. Each of the gamma voltages VGM2 to VGM(n−1) may be outputted via a connection terminal between two adjacent resistors. The gamma voltage VGMn may be outputted via the terminal 606. Therefore, the gamma voltage generating circuit 106 generates the gamma voltages VGM1-VGMn corresponding to a gamma curve according to the compensated gamma reference voltages VCGR1 and VCGR2. The gamma voltages VGM1-VGMn are generated based on the compensated gamma reference voltages VCGR1 and VCGR2 and each gamma voltage may include at least a portion of signal components of the common voltage VCOM since both the compensated gamma reference voltages VCGR1 and VCGR2 include at least a portion of the signal component of the common voltage VCOM.

In addition, each resistor of the resistors R1 to R(n−1) of the voltage dividing circuit 602 may be a single resistor or a combination of multiple resistors. The voltage dividing circuit 602 may be implemented with diodes and/or diode-connected transistors, or any circuit elements capable of generating equivalent impedances. The reference voltage generating circuit 102 may generate gamma reference voltages based on a gamma curve and the gamma voltage generating circuit 106 may generate the gamma voltages VGM1-VGMn based on the same gamma curve used by the reference voltage generating circuit 102.

Figure 7:
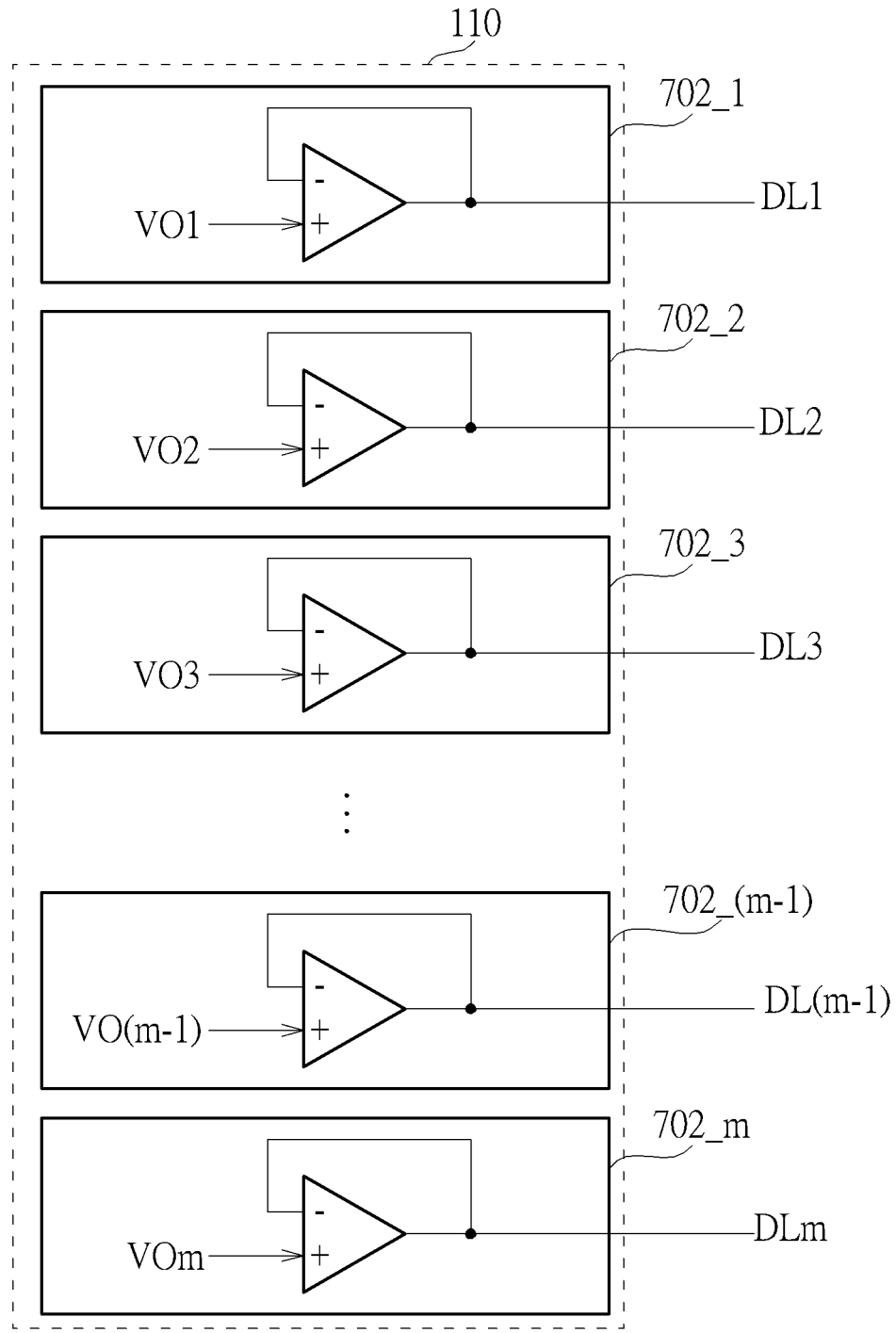
FIG. 7 is a schematic diagram of the output circuit of the source driving circuit shown in FIG. 2 according to an embodiment of the present invention.

Please further refer to FIG. 2 and FIG. 6, the DAC 108 is coupled to the gamma voltage generating circuit 106 and configured to receive image data from the timing controller 12 and generate data driving voltages VO1 to VOm corresponding to the image data according to the gamma reference voltages VGM1-VGMn, where m represents the total output channel number. The DAC 108 is configured to select the respective gamma reference voltage corresponding to the grayscale level of the image data from the gamma reference voltages VGM1-VGMn for acting as the respective data driving voltage. Please refer to FIG. 7, which is a schematic diagram of the output circuit 110 of the source driving circuit 10 shown in FIG. 2 according to an embodiment of the present invention. The output circuit 110 is coupled to the DAC 108 and configured to output the data driving voltages VO1 to VOm corresponding to the image data to drive pixels of the display panel 16 via data lines DL1 to DLm respectively. The output circuit 110 includes buffer circuits 702_1 to 702_m. Each buffer circuit is configured to output respective data driving voltage to the respective data line. For example, each buffer circuit may be implemented by a unity gain voltage follower amplifier, but not limited to.

Figure 8:
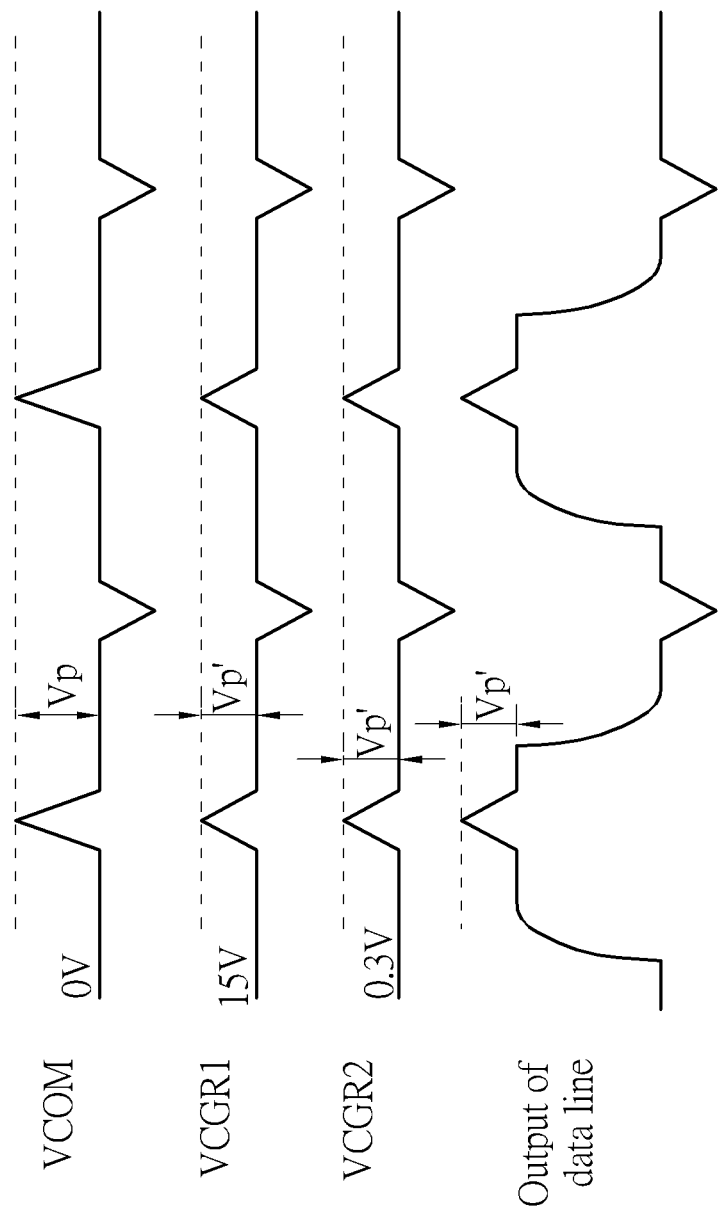
FIG. 8 is a waveform diagram of the display apparatus shown in FIG. 2 according to an embodiment of the invention.

FIG. 8 is a waveform diagram of the display apparatus shown in FIG. 2 according to an embodiment of the invention. The common voltage VCOM is applied to the common electrode of the display panel 16. The compensation circuits 104_1 and 104_2 may receive the voltage VCOMP via the metal wire connected to the common electrode on the display panel 16 and generate compensated gamma reference voltages VCGR1 and VCGR2 according to the gamma reference voltages VGR1 and VGR2, and the voltage VCOMP associated with the common voltage VCOM. The voltage VCOMP may be a first ratio of the common voltage VCOM. As shown in FIG. 8, when noise impacts on the common voltage VCOM, a noise peak Vp occurs on the waveform of the common voltage VCOM, there is a voltage variation with a peak value Vp' on the gamma reference voltages VGR1 and VGR2. The peak value Vp' may be a first ratio of the noise peak Vp. Under such a condition, each of the data driving voltages VO1 to VOm corresponding to the image data also includes the voltage variation with the peak value Vp'. After the data driving voltages VO1 to VOm corresponding to the image data are outputted to drive the pixels of display panel 16 via the data lines DL1 to DLm. The voltage difference between the data driving voltage on the pixel electrode of the display panel 16 and the common voltage on the common electrode will not deviate from the desired pixel data voltage since the data driving voltages VO1 to VOm varying with the common voltage.

Figure 9:
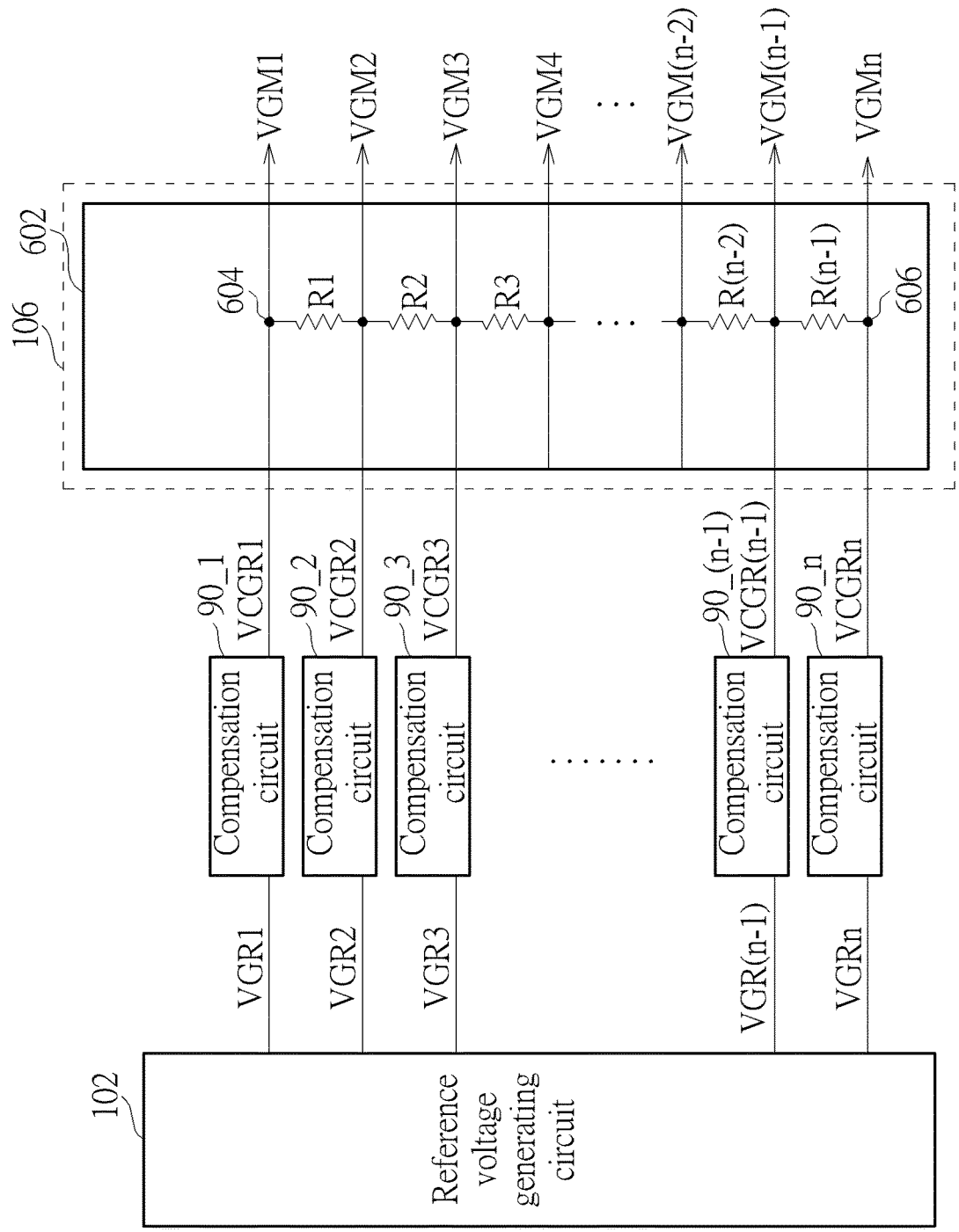
FIG. 9 is a diagram illustrating an alternative design of the compensation circuits shown in FIG. 2 according to an embodiment of the present invention.

Please further refer to FIG. 2. As shown in FIG. 2, the source driving circuit 10 includes the compensation circuits 104_1 and 104_2 for generating the compensated gamma reference voltages VCGR1 and VCGR2, such that the gamma voltage generating circuit 106 generates gamma voltages VGM1-VGMn according to the compensated gamma reference voltages VCGR1 and VCGR2. The number of the compensation circuits is not limited, and may be varied and designed according to practical system demands. For example, please refer to FIG. 9, which is a diagram illustrating an alternative design of the compensation circuits applied in the source driving circuit 10 shown in FIG. 2 according to an embodiment of the invention. As shown in FIG. 9, the reference voltage generating circuit 102 is configured to generate gamma reference voltages VGR1 to VGRn according to a gamma curve. The gamma reference voltage VGR1 may be a maximum gamma voltage based on the gamma curve and correspond to the maximum grayscale level among all grayscale levels before common voltage noise compensation. The gamma reference voltage VGRn may be a minimum gamma voltage based on the gamma curve and correspond to the minimum grayscale among all grayscales before common voltage noise compensation. Compensation circuits 90_1 to 90_n are coupled to the reference voltage generating circuit 102. Similar to the compensation circuits 104_1 and 104_2 shown in FIG. 2, each of the compensation circuits 90_1 to 90_n has similar functions and structures as the compensation circuits 104_1 and 104_2. Each of the compensation circuits 90_1 to 90_n is coupled to the reference voltage generating circuit 102 for receiving a respective gamma reference voltage and configured to generate a respective compensated gamma reference voltage by adding the received gamma reference voltage with the voltage VCOMP associated with the common voltage VCOM. The compensation circuits 90_1 to 90_n generate compensated gamma reference voltages VCGR1 to VCGRn according to the gamma reference voltages VGR1 to VGRn, such that the gamma voltage generating circuit 106 generates gamma voltages VGM1-VGMn according to the compensated gamma reference voltages VCGR1 to VCGRn. As shown in FIG. 9, the compensated gamma reference voltage VCGR1 may be an upper limit level of a range of the gamma voltages VGM1-VGMn and the compensated gamma reference voltages VCGRn may be a lower limit level of the range of the gamma voltages VGM1-VGMn.

To sum up, the embodiment of the present invention may generate data driving voltages by compensating the gamma reference voltage without adjusting the common voltage, thereby eliminating common noise effect, reducing crosstalk effect, and providing color accuracy and consistency of pixels.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A source driving circuit, comprising:
a reference voltage generating circuit, configured to generate a plurality of gamma reference voltages;
a plurality of compensation circuits, coupled to the reference voltage generating circuit and configured to generate a plurality of compensated gamma reference voltages according to the plurality of gamma reference voltages and a voltage associated with a common voltage, wherein a first compensation circuit of the plurality of compensation circuits comprises a first amplifier circuit, wherein the first amplifier circuit comprises a first input terminal, a second input terminal, a third input terminal and an output terminal, wherein the first input terminal of the first amplifier circuit is coupled to the reference voltage generating circuit for receiving a first gamma reference voltage of the plurality of gamma reference voltages, the second input terminal of the first amplifier circuit receives the voltage associated with the common voltage, the third input terminal of the first amplifier circuit is coupled to the output terminal of the first amplifier circuit, and the output terminal of the first amplifier circuit outputs a first compensated gamma reference voltage of the plurality of compensated gamma reference voltages;
a gamma voltage generating circuit, coupled to the plurality of compensation circuits and configured to generate a plurality of gamma voltages according to the plurality of compensated gamma reference voltages; and
a digital to analog converter, coupled to the gamma voltage generating circuit and configured to generate a plurality of data driving voltages corresponding to image data according to the plurality of gamma voltages.

2. The source driving circuit of claim 1, wherein each of the plurality of compensation circuits is coupled to the reference voltage circuit for receiving a respective gamma reference voltage and configured to generate a respective compensated gamma reference voltage by adding the received gamma reference voltage with the voltage associated with the common voltage.

3. The source driving circuit of claim 1, wherein the first gamma reference voltage corresponds to the maximum grayscale level among all grayscale levels of image data before a compensation operation and the first compensated gamma reference voltage corresponds to the maximum grayscale level after the compensation operation.

4. The source driving circuit of claim 1, wherein the first compensated gamma reference voltage is a sum of the first gamma reference voltage and the voltage associated with the common voltage.

5. The source driving circuit of claim 1, wherein the first amplifier circuit comprises:
a first input stage, comprising:
a first transistor, comprising a first terminal, a second terminal and a control terminal, wherein the control terminal of the first transistor is coupled to the reference voltage generating circuit for receiving the first gamma reference voltage;
a second transistor, comprising a first terminal, a second terminal and a control terminal, wherein the first terminal of the second transistor is coupled to the first terminal of the first transistor and the control terminal of the second transistor receives the voltage associated with the common voltage; and
a third transistor, comprising a first terminal, a second terminal and a control terminal, wherein the first terminal of the third transistor is coupled to the second terminal of the first transistor and the second terminal of the second transistor;
a first current mirror, coupled to first input stage, comprising:
a fourth transistor, comprising a first terminal, a second terminal and a control terminal, wherein the first terminal of the fourth transistor is coupled to the first terminal of the first transistor, the first terminal of the second transistor and the control terminal of the fourth transistor; and
a fifth transistor, comprising a first terminal, a second terminal and a control terminal, wherein the control terminal of the fifth transistor is coupled to the first terminal of the first transistor, the first terminal of the second transistor, the first terminal of the fourth transistor and the control terminal of the fourth transistor; and
a first output stage, comprising:
a sixth transistor, comprising a first terminal, a second terminal and a control terminal, wherein the first terminal of the sixth transistor is coupled to the first terminal of the fifth transistor for outputting the first compensated gamma reference voltage, the second terminal of the sixth transistor is coupled to the second terminal of the first transistor, the second terminal of the second transistor and the first terminal of the third transistor.

6. The source driving circuit of claim 1, wherein a second compensation circuit of the plurality of compensation circuits comprises a second amplifier circuit, wherein the first amplifier circuit comprises a first input terminal, a second input terminal, a third input terminal and an output terminal, wherein the first input terminal of the second amplifier circuit is coupled to the reference voltage generating circuit for receiving a second gamma reference voltage of the plurality of gamma reference voltages, the second input terminal of the second amplifier circuit receives the voltage associated with the common voltage, the third input terminal of the second amplifier circuit is coupled to the output terminal of the second amplifier circuit, the output terminal of the amplifier circuit outputs a second compensated gamma reference voltage of the plurality of compensated gamma reference voltages, wherein the second gamma reference voltage corresponds to the minimum grayscale level among all grayscale levels of image data before a compensation operation and the second compensated gamma reference voltage corresponds to the minimum grayscale level among all grayscale levels of image data after the compensation operation.

7. The source driving circuit of claim 6, wherein the second compensated gamma reference voltage is a sum of the second gamma reference voltage and the voltage associated with the common voltage.

8. The source driving circuit of claim 6, wherein the second amplifier circuit comprises:
  a second input stage, comprising:
    a seventh transistor, comprising a first terminal, a second terminal and a control terminal, wherein the control terminal of the seventh transistor is coupled to the reference voltage generating circuit for receiving the second gamma reference voltage;
    an eighth transistor, comprising a first terminal, a second terminal and a control terminal, wherein the first terminal of the eighth transistor is coupled to the first terminal of the seventh transistor and the control terminal of the eighth transistor receives the voltage associated with the common voltage; and
    a ninth transistor, comprising a first terminal, a second terminal and a control terminal, wherein the first terminal of the ninth transistor is coupled to the second terminal of the seventh transistor and the second terminal of the eighth transistor;
  a second current mirror, coupled to second input stage, comprising:
    a tenth transistor, comprising a first terminal, a second terminal and a control terminal, wherein the first terminal of the tenth transistor is coupled to the first terminal of the seventh transistor, the first terminal of the eighth transistor and the control terminal of the tenth transistor; and
    an eleventh transistor, comprising a first terminal, a second terminal and a control terminal, wherein the control terminal of the eleventh transistor is coupled to the first terminal of the seventh transistor, the first terminal of the eighth transistor, the first terminal of the tenth transistor and the control terminal of the tenth transistor; and
  a second output stage, comprising:
    a twelfth transistor, comprising a first terminal, a second terminal and a control terminal, wherein the first terminal of the twelfth transistor is coupled to the first terminal of the eleventh transistor for outputting the second compensated gamma reference voltage, the second terminal of the twelfth transistor is coupled to the second terminal of the seventh transistor, the second terminal of the eighth transistor and the first terminal of the ninth transistor.

9. The source driving circuit of claim 1, further comprising:
  an output circuit, coupled to the digital to analog converter and configured to output the plurality of data driving voltages corresponding to image data to a display panel.

10. A display apparatus, comprising:
  a display panel, comprising a plurality of pixels, wherein each pixel is driven according to a respective data voltage; and
  a source driving circuit, comprising:
    a reference voltage generating circuit, configured to generate a plurality of gamma reference voltages;
    a plurality of compensation circuits, coupled to the reference voltage generating circuit and configured to generate a plurality of compensated gamma reference voltages according to the plurality of gamma reference voltages and a voltage associated with a common voltage, wherein a first compensation circuit of the plurality of compensation circuits comprises a first amplifier circuit, wherein the first amplifier circuit comprises a first input terminal, a second input terminal, a third input terminal and an output terminal, wherein the first input terminal of the first amplifier circuit is coupled to the reference voltage generating circuit for receiving a first gamma reference voltage of the plurality of gamma reference voltages, the second input terminal of the first amplifier circuit receives the voltage associated with the common voltage, the third input terminal of the first amplifier circuit is coupled to the output terminal of the first amplifier circuit, the output terminal of the first amplifier circuit outputs a first compensated gamma reference voltage of the plurality of compensated gamma reference voltages;
    a gamma voltage generating circuit, coupled to the plurality of compensation circuits and configured to generate a plurality of gamma voltages according to the plurality of compensated gamma reference voltages; and
    a digital to analog converter, coupled to the gamma voltage generating circuit and configured to generate a plurality of data driving voltages corresponding to image data to drive the pixels of the display panel according to the plurality of gamma voltages.

11. The display apparatus of claim 10, wherein each of the plurality of compensation circuits is coupled to the reference voltage circuit for receiving a respective gamma reference voltage and configured to generate a respective compensated gamma reference voltage by adding the received gamma reference voltage with the voltage associated with the common voltage.

12. The display apparatus of claim 10, wherein the first gamma reference voltage corresponds to the maximum grayscale level among all grayscale levels of image data before a compensation operation and the first compensated gamma reference voltage corresponds to the maximum grayscale level after the compensation operation.

13. The display apparatus of claim 10, wherein the first compensated gamma reference voltage is a sum of the first gamma reference voltage and the voltage associated with the common voltage.

14. The display apparatus of claim 10, wherein the first amplifier circuit comprises:
  a first input stage, comprising:
    a first transistor, comprising a first terminal, a second terminal and a control terminal, wherein the control terminal of the first transistor is coupled to the reference voltage generating circuit for receiving the first gamma reference voltage;
    a second transistor, comprising a first terminal, a second terminal and a control terminal, wherein the first terminal of the second transistor is coupled to the first terminal of the first transistor and the control terminal of the second transistor receives the voltage associated with the common voltage; and a third transistor, comprising a first terminal, a second terminal and a control terminal, wherein the first terminal of the third transistor is coupled to the second terminal of the first transistor and the second terminal of the second transistor;

a first current mirror, coupled to first input stage, comprising:

a fourth transistor, comprising a first terminal, a second terminal and a control terminal, wherein the first terminal of the fourth transistor is coupled to the first terminal of the first transistor, the first terminal of the second transistor and the control terminal of the fourth transistor; and a fifth transistor, comprising a first terminal, a second terminal and a control terminal, wherein the control terminal of the fifth transistor is coupled to the first terminal of the first transistor, the first terminal of the second transistor, the first terminal of the fourth transistor and the control terminal of the fourth transistor; and a first output stage, comprising:

a sixth transistor, comprising a first terminal, a second terminal and a control terminal, wherein the first terminal of the sixth transistor is coupled to the first terminal of the fifth transistor for outputting the first compensated gamma reference voltage, the second terminal of the sixth transistor is coupled to the second terminal of the first transistor, the second terminal of the second transistor and the first terminal of the third transistor.

15. The display apparatus of claim 10, wherein a second compensation circuit of the plurality of compensation circuits comprises a second amplifier circuit, wherein the first amplifier circuit comprises a first input terminal, a second input terminal, a third input terminal and an output terminal, wherein the first input terminal of the second amplifier circuit is coupled to the reference voltage generating circuit for receiving a second gamma reference voltage of the plurality of gamma reference voltages, the second input terminal of the second amplifier circuit receives the voltage associated with the common voltage, the third input terminal of the second amplifier circuit is coupled to the output terminal of the second amplifier circuit, the output terminal of the amplifier circuit outputs a second compensated gamma reference voltage of the plurality of compensated gamma reference voltages, wherein the second gamma reference voltage corresponds to the minimum grayscale level among all grayscale levels of image data before a compensation operation and the second compensated gamma reference voltage corresponds to the minimum grayscale level among all grayscale levels of image data after the compensation operation.

16. The display apparatus of claim 15, wherein the second compensated gamma reference voltage is a sum of the second gamma reference voltage and the voltage associated with the common voltage.

17. The display apparatus of claim 15, wherein the second amplifier circuit comprises:

a second input stage, comprising:

a seventh transistor, comprising a first terminal, a second terminal and a control terminal, wherein the control terminal of the seventh transistor is coupled to the reference voltage generating circuit for receiving the second gamma reference voltage;

an eighth transistor, comprising a first terminal, a second terminal and a control terminal, wherein the first terminal of the eighth transistor is coupled to the first terminal of the seventh transistor and the control terminal of the eighth transistor receives the voltage associated with the common voltage; and a ninth transistor, comprising a first terminal, a second terminal and a control terminal, wherein the first terminal of the ninth transistor is coupled to the second terminal of the seventh transistor and the second terminal of the eighth transistor;

a second current mirror, coupled to second input stage, comprising:

a tenth transistor, comprising a first terminal, a second terminal and a control terminal, wherein the first terminal of the tenth transistor is coupled to the first terminal of the seventh transistor, the first terminal of the eighth transistor and the control terminal of the tenth transistor; and an eleventh transistor, comprising a first terminal, a second terminal and a control terminal, wherein the control terminal of the eleventh transistor is coupled to the first terminal of the seventh transistor, the first terminal of the eighth transistor, the first terminal of the tenth transistor and the control terminal of the tenth transistor; and a second output stage, comprising:

a twelfth transistor, comprising a first terminal, a second terminal and a control terminal, wherein the first terminal of the twelfth transistor is coupled to the first terminal of the eleventh transistor for outputting the second compensated gamma reference voltage, the second terminal of the twelfth transistor is coupled to the second terminal of the seventh transistor, the second terminal of the eighth transistor and the first terminal of the ninth transistor.

18. The display apparatus of claim 10, further comprising:

an output circuit, coupled to the digital to analog converter and configured to output the plurality of data driving voltages corresponding to image data to a display panel.

19. An operation method of a display apparatus, the display apparatus comprising a display panel and a source driving circuit, the source driving circuit comprising a reference voltage generating circuit, a plurality of compensation circuits, a gamma voltage generating circuit, and a digital to analog converter, the operation method comprising:

utilizing the reference voltage generating circuit to generate a plurality of gamma reference voltages;

utilizing the plurality of compensation circuits to generate a plurality of compensated gamma reference voltages according to the plurality of gamma reference voltages and a voltage associated with a common voltage, wherein the plurality of compensation circuits comprise a first compensation circuit, the first compensation circuit comprises a first amplifier circuit, wherein the step comprises:

utilizing a first input terminal coupled to the reference voltage generating circuit of the first amplifier circuit to receive a first gamma reference voltage of the plurality of gamma reference voltages;

utilizing a second input terminal of the first amplifier circuit to receive the voltage associated with the common voltage; and utilizing an output terminal coupled to a third terminal of the first amplifier circuit to output a first compensated gamma reference voltage of the plurality of compensated gamma reference voltages;

utilizing the gamma voltage generating circuit to generate a plurality of gamma voltages according to the plurality of compensated gamma reference voltages; and utilizing the digital to analog converter to generate a plurality of data driving voltages corresponding to image data to drive pixels of the display panel of the display apparatus according to the plurality of gamma voltages.

20. The operation method of claim 19, wherein the step of utilizing the plurality of compensation circuits to generate the plurality of compensated gamma reference voltages according to the plurality of gamma reference voltages and voltage associated with common voltage comprises utilizing a respective compensation circuit of the plurality of compensation circuits to generate a respective compensated gamma reference voltage by adding the respective gamma reference voltage with the voltage associated with the common voltage.

* * * * *